United States Patent [19]

Sakihama et al.

[11] Patent Number: 4,918,408
[45] Date of Patent: Apr. 17, 1990

[54] OSCILLATION CIRCUIT

[75] Inventors: Kazuhisa Sakihama, Yokohama; Takuya Fujimoto, Kawasaki; Akihiro Sueda, Yokohama, all of Japan

[73] Assignee: Kabushiki Kaisha Toshiba, Kawasaki, Japan

[21] Appl. No.: 284,524

[22] Filed: Dec. 15, 1988

[30] Foreign Application Priority Data

Dec. 18, 1987 [JP] Japan .................... 62-320424

[51] Int. Cl.$^4$ ............................ H03B 5/36
[52] U.S. Cl. ...................... 331/116 R; 331/116 FE
[58] Field of Search ........ 331/108 A, 116 R, 116 FE, 331/117 R, 117 FE, 158, 173

[56] References Cited

U.S. PATENT DOCUMENTS 4,704,587 11/1987 Ouyang et al. .............. 331/116 FE

Primary Examiner—David Mis
Attorney, Agent, or Firm—Finnegan, Henderson, Farabow, Garrett and Dunner

[57] ABSTRACT

An oscillator including a CMOS inverter, a feedback reactance connected between the input and output terminals of the CMOS inverter and a CMOS transfer gate connected as a feedback resistor between the input and output terminals of the CMOS inverter, a power source terminal section to which an external voltage is applied, and a power control unit for converting the external voltage to a first internal voltage which is supplied as a power source voltage to the CMOS inverter. The power control unit converts the external voltage to a second internal voltage independently from the first internal voltage and supplies the second internal voltage as a gate control voltage to the CMOS transfer gate.

27 Claims, 6 Drawing Sheets

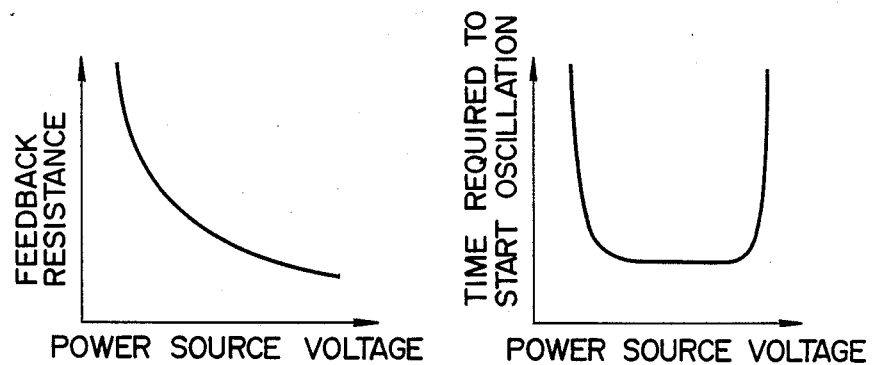
F I G. 2
(PRIOR ART)
F I G. 3
(PRIOR ART)
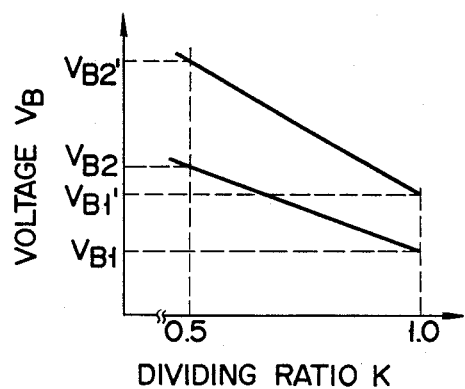
F I G. 4 (PRIOR ART)

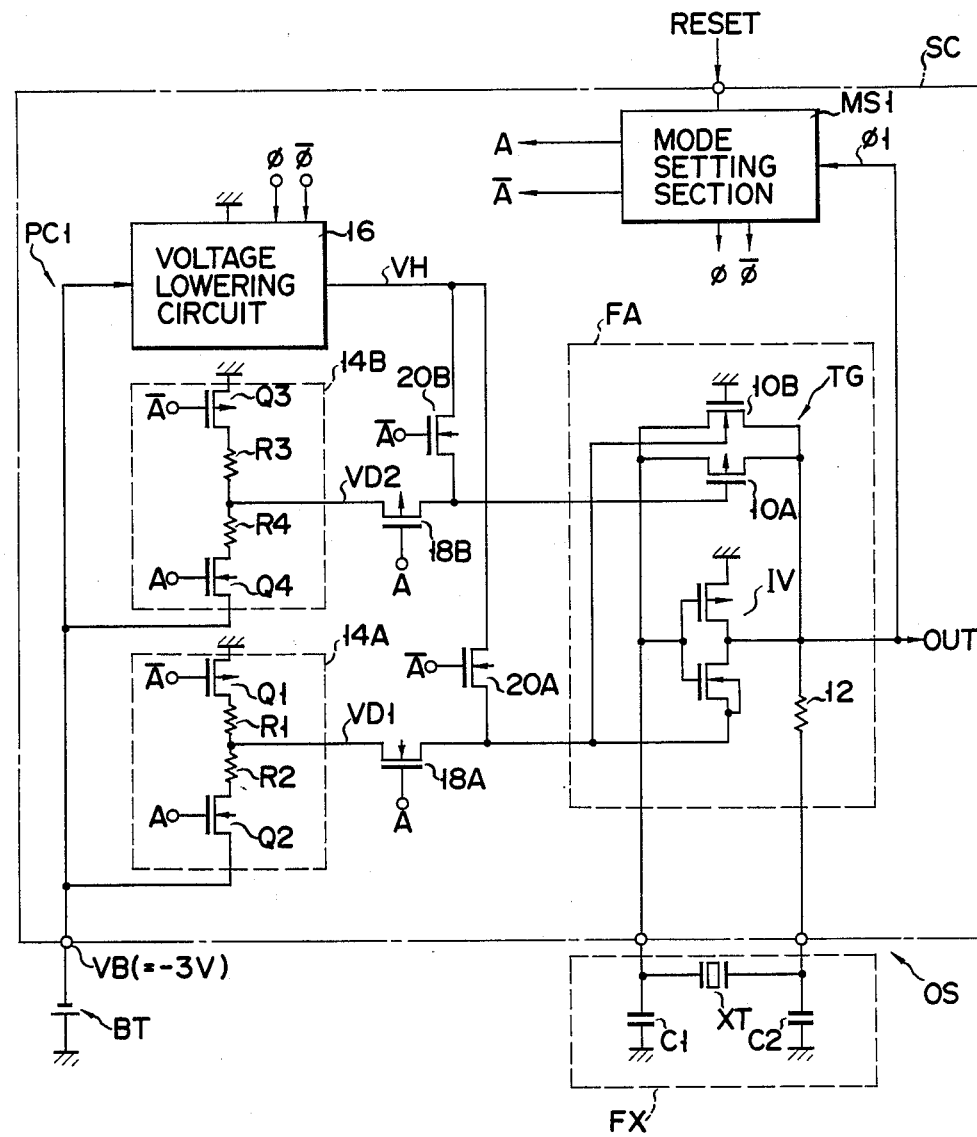
F I G. 5

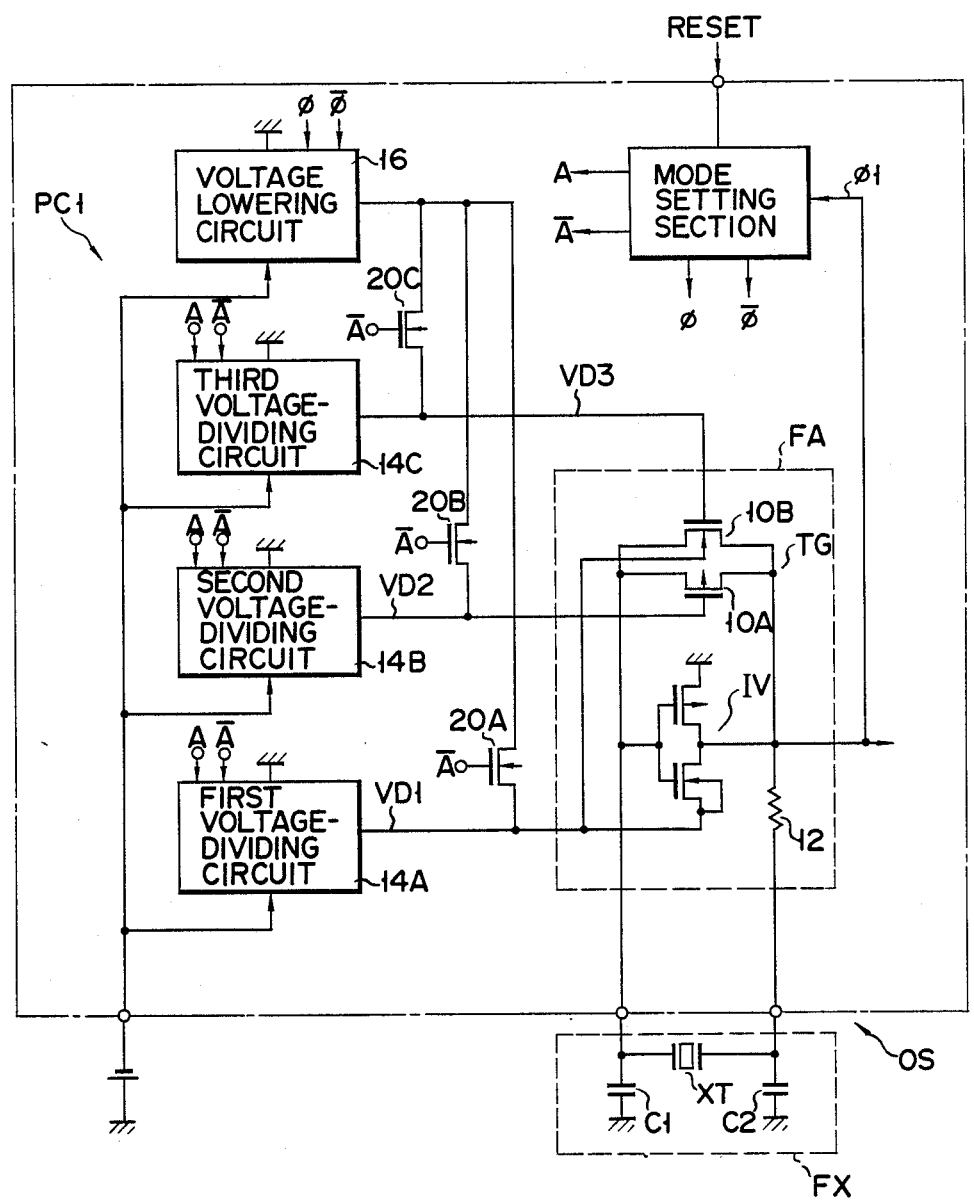
F I G. 9

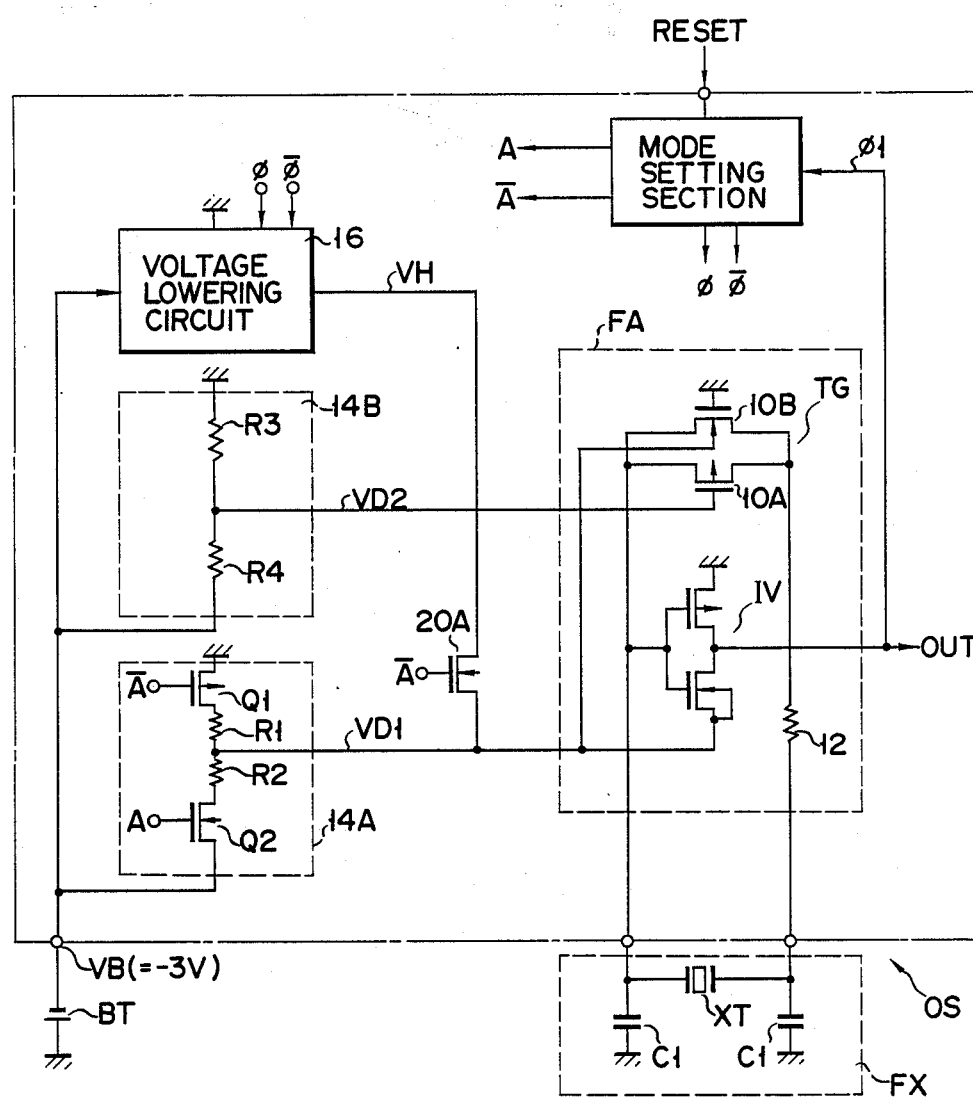
F I G. 10

OSCILLATION CIRCUIT

BACKGROUND OF THE INVENTION

1. Field of the Invention

This invention relates to an oscillation circuit having a transfer gate as a feedback resistor.

2. Description of the Related Art

Recently, most of portable type electronic devices are formed to contain semiconductor integrated circuit chips operated on a low power source voltage of 3V, for example. Such a low power source voltage is supplied from a lithium battery cell, for example, to the semiconductor integrated circuit chip. FIG. 1 shows the conventional crystal oscillation circuit which is designed to lengthen the service life of the battery. The crystal oscillation circuit includes power control unit PC, mode setting section MS and oscillator OS. Oscillator OS includes feedback reactance section FX and amplifier section FA. Feedback reactance section FX includes crystal resonator XT and capacitors C1 and C2, and amplifier section FA includes CMOS inverter IV and CMOS transfer gate TG respectively serving as an amplifier and a feedback resistor. Power control unit PC, mode setting section MS and feedback amplifier section FA are arranged in semiconductor integrated circuit chip SC, and feedback reactance section FX is arranged outside semiconductor integrated circuit chip SC. Power source voltage VB (3V) for semiconductor integrated circuit chip SC is supplied from battery BT.

Now, the operation of the crystal oscillation circuit is explained. When a reset signal is supplied to mode setting section MS, it sets the oscillation starting mode. In the oscillation starting mode, power control unit PC converts power source voltage VB to oscillation starting voltage VD. When oscillation starting voltage VD is supplied to oscillator OS, oscillator OS starts the oscillation operation so as to periodically generate pulses. Mode setting section MS counts the pulses sequentially generated from oscillator OS. When it is detected from the counted value that a preset time has elapsed after the starting of the oscillation operation and the oscillation operation becomes stable, then mode setting section MS changes the operation mode from the oscillation starting mode to the oscillation sustaining mode. In the oscillation sustaining mode, power control unit PC converts power source voltage VB to oscillation sustaining voltage VH which is smaller in absolute value than oscillation starting voltage VD. After this, oscillator OS is operated on oscillation sustaining voltage VH to sustain or continue the oscillation operation. In the crystal oscillation circuit, the power consumption is reduced after the oscillation operation becomes stable.

The driving ability of CMOS inverter IV and the resistance of CMOS transfer gate TG are dependent on the power source voltage of oscillator OS. In the oscillation starting mode, CMOS inverter IV is required to have larger driving ability than in the oscillation sustaining mode. If the driving ability of CMOS inverter IV is insufficient, oscillator OS cannot start the oscillation operation. As shown in FIG. 2, the resistance of CMOS transfer gate TG becomes smaller as the power source voltage of oscillator OS or oscillation starting voltage VD increases. When oscillation starting voltage VD is set too high, it becomes difficult to start the oscillation operation because of the excessive feedback of voltage.

Power control unit PC uses a voltage dividing circuit for converting power source voltage VB to oscillation starting voltage VD in the oscillation starting mode. When oscillator OS accidentally stops the oscillation operation, a reset signal is generated to set the oscillation starting mode again. In this case, power source voltage VB becomes lower than the initial voltage level because of the power consumption of the battery. Taking this into consideration, the voltage dividing ratio of the voltage dividing circuit K=VD/VB is set to a value closer to 1 so that the oscillation operation can be started without fail unless power source voltage VB is extremely reduced. FIG. 4 shows the relation between voltage dividing ratio K and the permissible variation range of power source voltage VB which is high enough to start the oscillation operation. When voltage dividing ratio K≈0.5, the lower and upper limits of the permissible variation range are respectively set to levels VB2 (=2.2V) and VB2' (=4.0V), for example. When voltage dividing ratio K≈1, the lower and upper limits of the permissible variation range are respectively set to levels VB1 (=1.1V) and VB1' (=2V), for example. Thus, in the crystal oscillation circuit, the permissible variation range of power source voltage VB is shifted when voltage dividing ratio K is changed.

The upper limit of the permissible variation range is set to a lower value as the voltage dividing ratio increases. In this case, the following defects will occur. At the time of shipment of the portable type electronic device, power source voltage VB of battery BT may probably be higher than 3V because the battery is not yet used. Therefore, when the upper limit of the permissible variation range is set to be lower than maximum power source voltage VB, oscillator OS will not start the oscillation operation.

SUMMARY OF THE INVENTION

An object of this invention is to provide an oscillation circuit capable of starting the oscillation operation with high reliability.

This object can be attained by an oscillation circuit comprising an oscillator section including an amplifier, a feedback reactance connected between input and output terminals of the amplifier and a transfer gate connected as a feedback resistor between the input and output terminals of the amplifier; a power source terminal section to which an external voltage is applied; and a power control section for independently converting the external voltage to first and second internal voltages which are respectively supplied as a power source voltage and a gate control voltage to the amplifier and transfer gate.

In the above oscillation circuit, the second internal voltage can be set to a desired level irrespective of the first internal voltage. Therefore, it is possible to set the first internal voltage to a high level so as to increase the driving ability of the amplifier and at the same time set the resistance of the transfer gate to a sufficiently large value. As a result, the oscillation circuit has a sufficiently large margin for fluctuation of an externally supplied voltage, and can start the oscillation operation with high reliability.

BRIEF DESCRIPTION OF THE DRAWINGS

FIG. 2 is a diagram illustrating the relation between the power source voltage and the feedback resistance of the crystal oscillation circuit of FIG. 1;

FIG. 3 is a diagram illustrating the relation between the power source voltage and the oscillation starting time of the crystal oscillation circuit of FIG. 1;

FIG. 4 is a diagram showing the permissible variation range of power source voltage VB by which the oscillation circuit can start the oscillation operation;

FIG. 5 shows the construction of a crystal oscillation circuit according to one embodiment of this invention;

FIG. 9 is a modification of the oscillation circuit shown in FIG. 5; and

FIG. 10 is another modification of the oscillation circuit shown in FIG. 5.

DETAILED DESCRIPTION OF THE PREFERRED EMBODIMENTS

Figure 1:
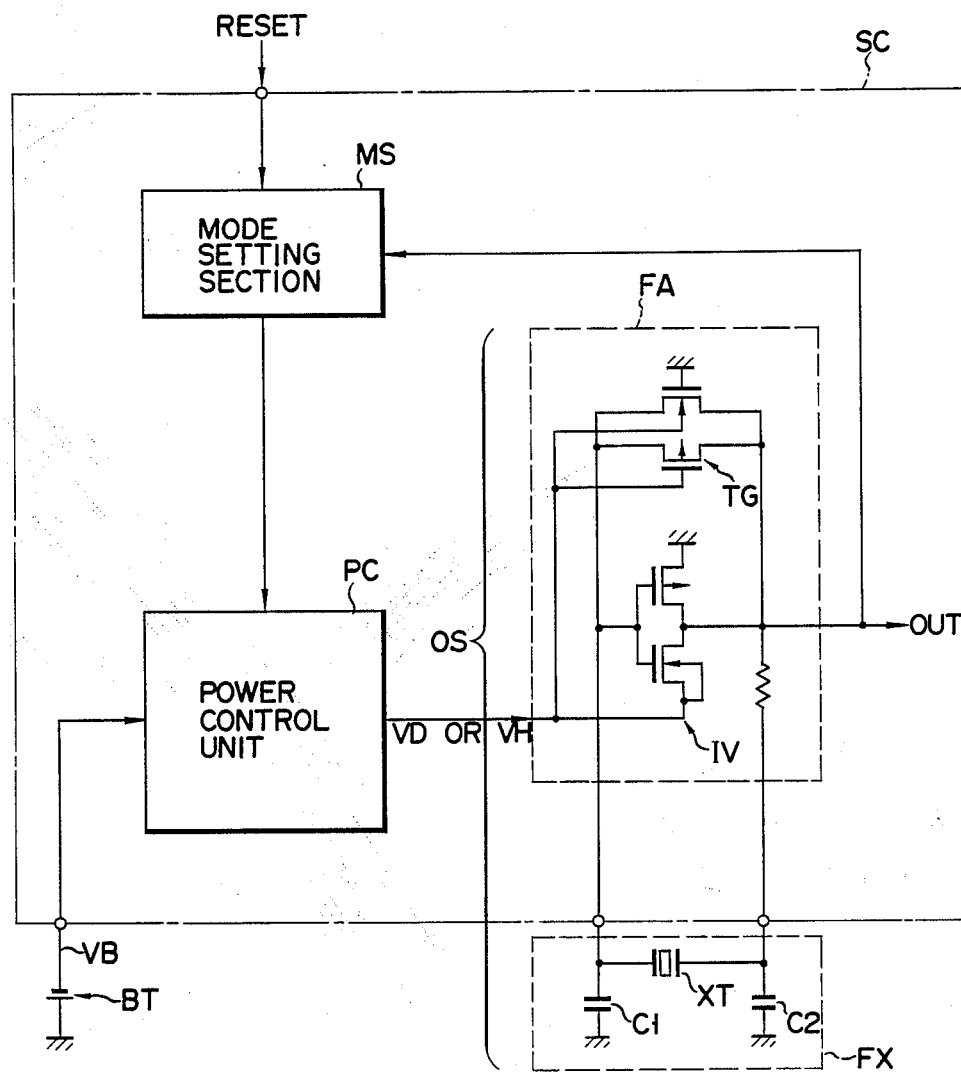
FIG. 1 shows the construction of the conventional crystal oscillation circuit.

There will now be described a crystal oscillation circuit according to one embodiment of this invention with reference to FIGS. 5 to 8. FIG. 5 shows the construction of the crystal oscillation circuit. The crystal oscillation circuit includes power control unit PC1, mode setting section MS1 and oscillator OS. Oscillator OS includes feedback reactance section FX and amplifier section FA. Feedback reactance section FX includes crystal resonator XT and capacitors C1 and C2, and amplifier section FA includes CMOS inverter IV and CMOS transfer gate TG respectively serving as an amplifier and a feedback resistor. Power control unit PC1, mode setting section MS1 and amplifier section FA are arranged in semiconductor integrated circuit chip SC, and feedback reactance section FX is arranged outside semiconductor integrated circuit chip SC. Power source voltage VB ($-3V$) for semiconductor integrated circuit chip SC is supplied from battery BT.

CMOS transfer gate TG includes P- and N-channel MOS transistors 10A and 10B whose current paths are each connected between the input and output terminals of CMOS inverter IV. The gate of N-channel MOS transistor 10B is connected to a ground terminal. The output terminal of CMOS inverter IV is connected to one end of resistor 12. Crystal resonator XT is connected between the input terminal of CMOS inverter IV and the other end of resistor 12. Capacitor C1 is connected between one end of crystal resonator XT and the ground terminal, and capacitor C2 is connected between the other end of crystal resonator XT and the ground terminal.

Power control unit PC1 includes voltage dividing circuit 14A for dividing power source voltage VB in the voltage dividing ratio K1 ($=1$) to generate first oscillation starting voltage VD1 ($=K1 \cdot VB$), voltage dividing circuit 14B for dividing power source voltage VB in the voltage dividing ratio K2 ($=0.5$) which is smaller than voltage dividing ratio K2 to generate second oscillation starting voltage VD2 ($K2 \cdot VB$), and voltage lowering or halving circuit 16 for lowering power source voltage VB to half to generate oscillation sustaining voltage VH. Voltage dividing circuit 14A includes P- and N-channel MOS transistors Q1 and Q2 and resistors R1 and R2. One end of resistor R1 is connected to one end of resistor R2, and the other end of resistor R1 is connected to the ground terminal via the current path of MOS transistor Q1. The other end of resistor R2 is connected to power source terminal VB via the current path of MOS transistor Q2. Voltage dividing circuit 14B includes P- and N-channel MOS transistors Q3 and Q4 and resistors R3 and R4. One end of resistor R3 is connected to one end of resistor R4, and the other end of resistor R3 is connected to the ground terminal via the current path of MOS transistor Q3. The other end of resistor R4 is connected to power source terminal VB via the current path of MOS transistor Q4. The gates of MOS transistors Q1 and Q3 are connected to mode setting section MS1 to receive mode control signal $\overline{A}$, and the gates of MOS transistors Q2 and Q4 are connected to mode setting section MS1 to receive mode control signal A. Voltage dividing ratio K1 is determined by R1/R1+R2, and voltage dividing ratio K2 is determined by R3/R3+R4. A connection node between resistors R1 and R2 serves as an output terminal of voltage dividing circuit 14A, and is connected to the power source terminal of CMOS inverter IV via the current path of N-channel MOS transistor 18A. A connection node between resistors R3 and R4 serves as an output terminal of voltage dividing circuit 14B, and is connected to the gate of MOS transistor 10A via the current path of N-channel MOS transistor 18B. MOS transistors Q1 to Q4, 18A and 18B are all turned on in the oscillation starting mode, and turned off in the oscillation sustaining mode. The output terminal of voltage lowering circuit 16 is connected to the power source terminal of CMOS inverter IV via the current path of N-channel MOS transistor 20A and to the gate of MOS transistor 10A via the current path of N-channel MOS transistor 20B. MOS transistors 20A and 20B are both turned off in the oscillation starting mode and turned on in the oscillation sustaining mode.

Figure 6:
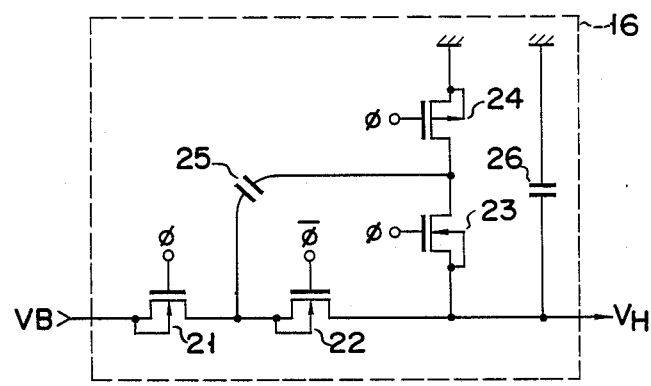
FIG. 6 is a circuit diagram showing in detail a voltage lowering circuit shown in FIG. 5.

FIG. 6 shows the construction of voltage lowering circuit 16 in detail. Voltage lowering circuit 16 includes N-channel MOS transistors 21, 22 and 23, P-channel MOS transistor 24, and capacitors 25 and 26. One end of the current path of MOS transistor 21 is connected to power source terminal VB, and the other terminal thereof is connected to the output terminal of voltage lowering circuit 16 via the current path of MOS transistor 22. One end of the current path of MOS transistor 24 is connected to the ground terminal, and the other terminal thereof is connected to the output terminal of voltage lowering circuit 16 via the current path of MOS transistor 23. One end of capacitor 25 is connected to a connection node between MOS transistors 21 and 22, and the other end thereof is connected to a connection node between MOS transistors 24 and 23. Capacitor 26 is connected between the output terminal of voltage lowering circuit 16 and the ground terminal. MOS transistor 21, 23 and 24 are connected to mode setting section MS1 to receive clock signal $\phi$ and MOS transistor 22 is connected to mode setting circuit MS1 to receive clock signal $\overline{\phi}$.

Figure 7:
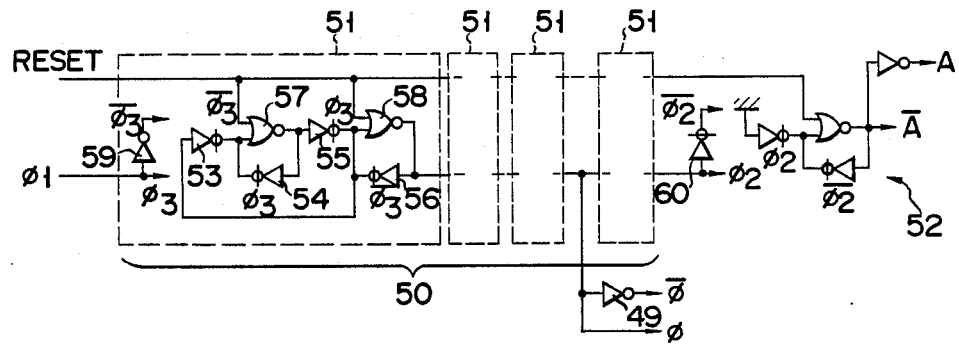
FIG. 7 is a circuit diagram showing in detail a mode setting section shown in FIG. 5.
Figure 8:
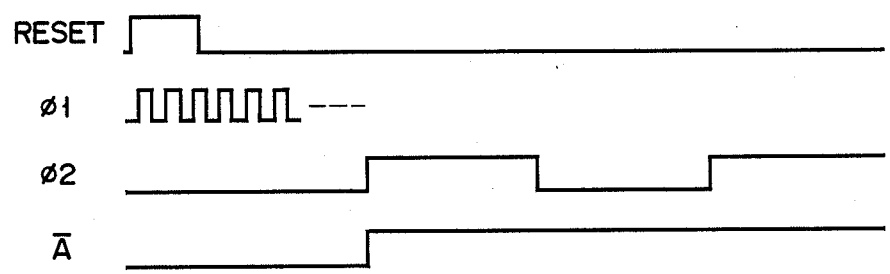
FIG. 8 is a signal waveform diagram illustrating the operation of the mode setting section.

FIG. 7 shows the construction of mode setting section MS1 in detail. Mode setting section MC1 includes frequency dividing circuit 50 and latch circuit 52. Frequency dividing circuit 50 includes n number of divide-by-2 (or $\frac{1}{2}$) frequency dividers 51 which are each constituted by clocked inverters 53 to 56 and 59, and NOR gates 57 and 58 and are cascade-connected to form a divide-by-$2^n$ frequency divider. When clock signal $\phi 1$ is generated from the output terminal of oscillator OS or the output terminal of CMOS inverter IV, clock signal $\phi1$ is supplied to the first stage of ½ frequency dividers 51. Clock signal $\bar{\phi}$ is derived from the intermediate stage of ½ frequency dividers 51, and clock signal $\phi$ is derived from inverter 49 which inverts clock signal $\bar{\phi}$. Clock signal 2 is derived from the last stage of ½ frequency dividers 51 and clock signal $\bar{\phi2}$ is derived from inverter 60 for inverting clock signal $\phi2$. The number n of frequency dividers 51 is so determined that clock signal $\phi2$ is changed from "0" level to "1" level when the oscillation operation of oscillator OS becomes stable. Latch circuit 52 latches "0" level signal by reset signal RESET. Mode setting section MS1 sets mode control signals A and $\bar{A}$ to "1" and "0" levels, respectively to set the oscillation starting mode in a period of time from the rise of reset signal RESET to the rise of clock signal $\phi2$. After the rise of clock signal $\phi2$, mode control signals A and $\bar{A}$ are respectively set to "0" and "1" levels to set the oscillation sustaining mode.

Next, the operation of the crystal oscillation circuit is explained. When a reset signal is supplied to mode setting section MS1, mode setting section MS1 sets the oscillation starting mode. In the oscillation starting mode, voltage dividing circuit 14A converts power source voltage VB to oscillation starting voltage VD1, and voltage dividing circuit 14B converts power source voltage VB to oscillation starting voltage VD2. When power source voltage VB is set at $-3V$, voltage VD1 is set to a voltage level closer to $-3V$, and voltage VD2 is set to a voltage level of approx. $-1.5V$. At this time, oscillation starting voltages VD1 and VD2 are respectively applied to CMOS inverter IV and MOS transistor 10A via MOS transistors 18A and 18B. Oscillator OS is operated on oscillation starting voltages VD1 and VD2 to start the oscillation operation so as to periodically generate pulses. Mode setting section MS1 counts pulses sequentially generated from oscillator OS, and changes the operation mode from the oscillation starting mode to the oscillation sustaining mode when it is detected based on the counted value that a preset time has passed after the oscillation operation has been started and the oscillation operation is set to be stable. In the oscillation sustaining mode, voltage lowering circuit 16 converts power source voltage VB to oscillation sustaining voltage VH. Oscillation sustaining voltage VH is supplied to CMOS inverter IV and MOS transistor 10A via MOS transistors 20A and 20B, respectively. Oscillator OS is operated on oscillation sustaining voltage VH to sustain the oscillation operation. In this case, since MOS transistors Q1 to Q4 are kept in the nonconductive state, voltage dividing circuits 14A and 14B will not consume any current.

In ths embodiment, oscillation starting voltage VD2 is set to be lower than oscillation starting voltage VD1. Therefore, the driving ability of CMOS inverter IV can be set sufficiently large and at the same time the resistance of CMOS transfer gate TG can be kept high. In the crystal oscillation circuit of this embodiment, the permissible variation range of power source voltage VB can be enlarged twice that in the case of the conventional crystal oscillation circuit shown in FIG. 4.

This invention is not limited to the above embodiment, and can be variously modified within the technical scope thereof. For example, it can be modified as shown in FIGS. 9 and 10.

Modified portions in the crystal oscillation circuit of FIG. 9 are explained below. In FIG. 9, the same portions as those in the above embodiment are denoted by the same reference numerals and the explanation thereof is omitted. Power control unit PC1 additionally includes voltage dividing circuit 14C which divides power source voltage VB in voltage dividing ratio K3 in the oscillation starting mode to generated oscillation starting voltage VD3. In this case, voltage dividing circuit 14C is constructed in the same manner as voltage dividing circuit 14B except voltage dividing ratio K3. The output terminal of voltage dividing circuit 14C is connected to the gate of MOS transistor 10B, and voltage lowering circuit 16 is connected to the gate of MOS transistor 10B via the current path of MOS transistor 20C. In the former embodiment, MOS transistors 18A and 18B are used, but they can be omitted.

In this modification, the resistance of the CMOS transfer gate can be more precisely adjusted by use of voltage dividing ratio K3. Further, no MOS transistor is connected between voltage dividing circuits 14A, 14B and 14C and oscillator OS, making the construction simple.

Modified portions in the crystal oscillation circuit of FIG. 10 are explained below. In FIG. 10, the same portions as those in the above embodiment are denoted by the same reference numerals and the explanation thereof is omitted. In the crystal oscillation circuit of FIG. 10, neither of MOS transistors Q3 and Q4 are provided in voltage dividing circuit 14B. Further, the output terminals of voltage dividing circuits 14A and 14B are directly connected to the power source terminal of CMOS inverter IV and the gate of MOS transistor 10A. In this case, the number of MOS transistors used is significantly reduced. In the oscillation sustaining mode, current flows via resistors R3 and R4 of voltage dividing circuit 14B. However, an output voltage of voltage dividing circuit 14B is used only to charge the gate of MOS transistor 10B. Therefore, it is possible to set the resistances of resistors R3 and R4 to a sufficiently large value so as to reduce the current consumption.

In the oscillation circuit of the embodiment, one of MOS transistors Q1, Q2 and 18A and one of MOS transistors Q3, Q4 and 18B can be omitted.

The crystal resonator used in the embodiment can be replaced by another type of resonator. Further, part of the feedback reactance can be formed inside the semiconductor integrated circuit chip. Each of capacitors C1 and C2 can be a parasitic capacitance between the chip and a wiring layer insulatively formed thereon.

According to this invention, the oscillation operation of the oscillation circuit can be started without receiving influence of fluctuation of the power source voltage caused by using the power source voltage supplied from a battery.

What is claimed is:
1. An oscillation circuit comprising:
a power source terminal section to which an external voltage is applied;
an oscillator section including an amplifier, a feedback reactance connected between input and output terminals of said amplifier, and a transfer gate connected as a feedback resistor between the input and output terminals of said amplifier and comprised of a plurality of switching elements; and
power control means for independently converting the external voltage to first, second, and third internal voltages which are respectively supplied as a power source voltage and as gate control voltages to said amplifier and to the plurality of switching elements comprising the transfer gate.

2. An oscillation circuit comprising:
a power source terminal section to which an external voltage is applied;
an oscillator section including an amplifier, a feedback reactance connected between input and output terminals of said amplifier and a transfer gate connected as a feedback resistor between the input and output terminals of said amplifier; and
power control means for independently converting the external voltage to first and second internal voltages which are respectively supplied as a power source voltage and a gate control voltage to said amplifier and transfer gate;
wherein said power control means includes a first voltage dividing circuit for dividing said external voltage in the first voltage dividing ratio to generate the first internal voltage, and a second voltage dividing circuit for dividing said external voltage in the second voltage dividing ratio to generate the second internal voltage, said second voltage dividing ratio being smaller than said first voltage dividing ratio.

3. An oscillation circuit according to claim 2, wherein said power control means includes first and second potential terminals, said second voltage dividing circuit includes first and second resistive means connected in series between said first and second potential terminals, and the junction between said first and second resistive means of said second voltage dividing circuit serves as an output terminal for said second internal voltage.

4. An oscillation circuit according to claim 3, wherein said first voltage dividing circuit includes first and second resistive means connected in series between said first and second potential terminals, and the junction between said first and second resistive means of said first voltage dividing circuit serves as an output terminal for said first internal voltage.

5. An oscillation circuit according to claim 4, wherein said power control means includes mode setting means for setting an oscillation starting mode and changing the oscillation starting mode to an oscillation sustaining mode after the oscillation operation of said oscillator becomes stable, a voltage lowering circuit for converting said external voltage to a third internal voltage lower than said first internal voltage, and a first delivering circuit for delivering said third internal voltage to said amplifier in place of said first internal voltage in said oscillation sustaining mode.

6. An oscillation circuit according to claim 5, wherein said first delivering circuit includes first switching means for delivering said third internal voltage to said amplifier in said oscillation sustaining mode and second switching means for inhibiting a current from flowing through the first and second resistive means of said first voltage dividing circuit in said oscillation sustaining mode.

7. An oscillation circuit according to claim 6, wherein said first switching means includes a switching element connected between said voltage lowering circuit and said amplifier.

8. An oscillation circuit according to claim 7, wherein said second switching means includes a switching element connected in series with said first resistive means between said first potential terminal and said output terminal for said first internal voltage and a switching element connected in series with said second resistive means between said output terminal for said first internal voltage and said second potential terminal.

9. An oscillation circuit according to claim 7, wherein said second switching means includes a switching element connected between said output terminal for said first internal voltage and said amplifier and a switching element connected in series with said first and second resistive means between said first and second potential terminals.

10. An oscillation circuit according to claim 5, wherein said power control means includes a second delivering circuit for delivering said third internal voltage to said transfer gate in place of said second internal voltage in said oscillation sustaining mode.

11. An oscillation circuit according to claim 10, wherein said second delivering circuit includes first switching means for delivering said third internal voltage to said transfer gate in said oscillation sustaining mode, and second switching means for inhibiting a current from flowing through the first and second resistive means of said second voltage dividing circuit in said oscillation sustaining mode.

12. An oscillation circuit according to claim 11, wherein said first switching means of the second delivering circuit includes a switching element connected between said voltage lowering circuit and said transfer gate.

13. An oscillation circuit according to claim 12, wherein said second switching means of the second delivering circuit includes a switching element connected in series with said first resistive means of the second voltage dividing circuit between said first potential terminal and said output terminal for said second internal voltage, and a switching element connected in series with said second resistive means of the second voltage dividing circuit between said output terminal for said second internal voltage and said second potential terminal.

14. An oscillation circuit according to claim 12, wherein said second switching means of the second delivering circuit includes a switching element connected between said output terminal for said second internal voltage and said transfer gate, and a switching element connected in series with said first and second resistive means of the second voltage dividing circuit between said first and second potential terminals.

15. An oscillation circuit comprising:
a power source terminal section to which an external voltage is applied;
an oscillator section including an amplifier, a feedback reactance connected between input and output terminals of said amplifier, and a CMOS transfer gate comprised of P-channel and N-channel MOS transistors connected as a feedback resistance between the input and output terminals of said amplifier; and
power control means for independently converting the external voltage to first, second, and third internal voltages which are respectively supplied as a power source voltage and gate control voltages to said amplifier and to the MOS transistors in the CMOS transfer gate.

16. A semiconductor device to which a feedback reactance is connected to form an oscillation circuit, comprising:
a power source terminal section to which an external voltage is applied;

an oscillator section including an amplifier and a transfer gate which is connected between the input and output terminals of said amplifier to serve as a feedback resistance parallel to said feedback reactance and comprised of a plurality of switching elements; and power control means for independently converting the external voltage to first, second, and third internal voltages which are respectively supplied as a power source voltage and as gate control voltages to said amplifier and to the plurality of switching elements comprising the transfer gate.

17. An oscillation circuit according to claim 16, wherein said power control means includes a first voltage dividing circuit for dividing said external voltage in the first voltage dividing ratio to generate the first internal voltage, a second voltage dividing circuit for dividing said external voltage in the second voltage dividing ratio to generate the second internal voltage, and a third voltage dividing circuit for dividing said external voltage in the third voltage dividing ratio to generate the third internal voltage, said second and third voltage dividing ratios being smaller than said first voltage dividing ratio.

18. An oscillation circuit according to claim 17, wherein said power control means includes first and second potential terminals, said second and third voltage dividing circuits each include first and second resistive means connected in series between said first and second potential terminals, and the junctions between said first and second resistive means of said second and third voltage dividing circuits respectively serve as output terminals for said second and third internal voltages.

19. An oscillation circuit according to claim 17, wherein said power control means includes first and second potential terminals, said first voltage dividing circuit includes first and second resistive means connected in series between said first and second potential terminals, and the junction between said first and second resistive means of said first voltage dividing circuit serves as an output terminal for said first internal voltage.

20. An oscillation circuit according to claim 19, wherein said power control means includes mode setting means for setting an oscillation starting mode and changing the oscillation starting mode to an oscillation sustaining mode after the oscillation operation of said oscillator becomes stable, a voltage lowering circuit for converting said external voltage to a fourth internal voltage lower than said first internal voltage, and a first delivering circuit for delivering said fourth internal voltage to said amplifier in place of said first internal voltage in said oscillation sustaining mode.

21. An oscillation circuit according to claim 20, wherein said power control means includes a second and a third delivering circuit for delivering said fourth internal voltage to the switching elements in the transfer gate in place of said second and third internal voltages in said oscillation sustaining mode.

22. An oscillation circuit according to claim 20, wherein said first delivering circuit includes first switching means for delivering said fourth internal voltage to said amplifier in said oscillation sustaining mode, and second switching means for inhibiting a current from flowing through the first and second resistive means of said first voltage dividing circuit in said oscillation sustaining mode.

23. An oscillation circuit according to claim 18, wherein said power control means includes mode setting means for setting an oscillation starting mode and changing the oscillation starting mode to an oscillation sustaining mode after the oscillation operation of said oscillator becomes stable, a voltage lowering circuit for converting said external voltage to a fourth internal voltage lower than said first internal voltage, and a first delivering circuit for delivering said fourth internal voltage to said amplifier in place of said first internal voltage in said oscillation sustaining mode.

24. An oscillation circuit according to claim 23, wherein said power control means includes a second and a third delivering circuit for delivering said fourth internal voltage to the switching elements in the transfer gate in place of said second and third internal voltages in said oscillation sustaining mode.

25. An oscillation circuit according to claim 24, wherein said second delivering circuit includes
first switching means for delivering said fourth internal voltage to one of the switching elements in the transfer gate in said oscillation sustaining mode, and
second switching means for inhibiting a current from flowing through the first and second resistive means of said second voltage dividing circuit in said oscillation sustaining mode; and
wherein said third delivering circuit includes
first switching means for delivering said fourth internal voltage to another one of the switching elements in the transfer gate in said oscillation sustaining mode, and
second switching means for inhibiting a current from flowing through the first and second resistive means of said third voltage dividing circuit in said oscillation sustaining mode.

26. An oscillation circuit according to claim 16, wherein said power control means includes mode setting means for setting an oscillation starting mode and changing the oscillation starting mode to an oscillation sustaining mode after the oscillation operation of said oscillator becomes stable, a voltage lowering circuit for converting said external voltage to a fourth internal voltage lower than said first internal voltage, and a first delivering circuit for delivering said fourth internal voltage to said amplifier in place of said first internal voltage in said oscillation sustaining mode.

27. An oscillation circuit according to claim 26, wherein said power control means includes a second and a third delivering circuit for delivering said fourth internal voltage to the switching elements in the transfer gate in place of said second and third internal voltages in said oscillation sustaining mode.

* * * * *